(12) United States Patent
Suzuki et al.

(10) Patent No.: US 7,535,266 B2
(45) Date of Patent: May 19, 2009

(54) LIGHT EMITTING DEVICE DRIVING CIRCUIT

(75) Inventors: Takashi Suzuki, Hamamatsu (JP); Seiichiro Mizuno, Hamamatsu (JP)

(73) Assignee: Hamamatsu Phontonics K.K., Hamamatsu-shi, Shizuoka (JP)

( * ) Notice: Subject to any disclaimer, the term of this patent is extended or adjusted under 35 U.S.C. 154(b) by 718 days.

(21) Appl. No.: 10/491,414

(22) PCT Filed: Oct. 2, 2002

(86) PCT No.: PCT/JP02/10300

§ 371 (c)(1),
(2), (4) Date: Apr. 1, 2004

(87) PCT Pub. No.: WO03/032455

PCT Pub. Date: Apr. 17, 2003

(65) Prior Publication Data

US 2004/0251856 A1    Dec. 16, 2004

(30) Foreign Application Priority Data

Oct. 2, 2001    (JP) ............................. 2001-306613

(51) Int. Cl.
*H03B 1/00* (2006.01)
*H03K 3/00* (2006.01)

(52) U.S. Cl. ....................... 327/108; 315/291
(58) Field of Classification Search ................. 327/108; 315/291, 219
See application file for complete search history.

(56) References Cited

U.S. PATENT DOCUMENTS

| | | | |
|---|---|---|---|
| 5,614,860 A | * | 3/1997 | Osaki et al. .................. 327/552 |
| 5,898,334 A | | 4/1999 | Fairgrieve ..................... 37/411 |
| 5,949,278 A | * | 9/1999 | Oguey ......................... 327/543 |
| 6,985,036 B2 | * | 1/2006 | Bhattacharjee et al. ...... 330/254 |
| 7,057,448 B2 | * | 6/2006 | Tanigawa et al. ............ 327/543 |

(Continued)

FOREIGN PATENT DOCUMENTS

EP    1 003 256 A2    5/2000

(Continued)

OTHER PUBLICATIONS

Nagahori et al., "An Analog Front-End Chip Set Employing an Electro-Optical Mixed Design on SPICE for 5-Gb/s/ch Parallel Optical Interconnection", IEEE Journal of Solid-State Circuits, vol. 36, No. 12, Dec. 2001, pp. 1984-1991.

*Primary Examiner*—Quan Tra
(74) *Attorney, Agent, or Firm*—Drinker Biddle & Reath LLP

(57) ABSTRACT

The circuit comprises an amplitude setting transistor 5Q for controlling the amplitude of high-frequency current I2QB flowing through the second current mirror circuit 2, by using an input of reference direct current signal Bias. Direct current component I4QB generated based on reference direct current signal Bias is subtracted from direct current I1 flowing through the other side line of the first current mirror circuit 1. In this case, level fluctuation of driving current IZ can be significantly suppressed, since the increment of the direct current component included in high-frequency current I2QB is proportional to direct current component I4QB which is subtracted from direct current I1 flowing through said other side line of the first current mirror circuit 1.

5 Claims, 2 Drawing Sheets

U.S. PATENT DOCUMENTS

| | | | |
|---|---|---|---|
| 7,138,868 B2 * | 11/2006 | Sanchez et al. | 330/256 |
| 2002/0060524 A1 * | 5/2002 | Kim et al. | 315/169.3 |
| 2002/0105373 A1 * | 8/2002 | Sudo | 327/538 |

FOREIGN PATENT DOCUMENTS

| | | | |
|---|---|---|---|
| JP | 63-251945 | | 10/1988 |
| JP | 06-045675 | | 2/1994 |
| JP | 08-186312 | | 7/1996 |
| JP | 11-126935 | | 5/1999 |
| JP | 2001-237489 | | 8/2001 |
| JP | 2001237489 | A * | 8/2001 |

* cited by examiner

LIGHT EMITTING DEVICE DRIVING CIRCUIT

TECHNICAL FIELD

The present invention relates to light emitting device driving circuits.

BACKGROUND ART

An Optical pickup is a device which can read information stored on storage media such as CDs or a DVDs by irradiating laser light from laser diodes onto the storage media and monitoring the light reflected therefrom. Laser diodes may also be used for writing information on storage media. Heretofore, driving circuits for such laser diodes have been developed.

DISCLOSURE OF THE INVENTION

In an optical pickup, unnecessary light or background light reflected in the apparatus may enter the photo-detector to become noise contained in required information. In addition, when the light reflected in storage media returns to a light emitting device and enters the light emitting device, light emission of the light emitting device may become unstable, causing a noise.

Accordingly, it is conceivable that an approach for driving light emitting device at high-frequency causes noise tolerance to improve. High-frequency current is superimposed onto direct current components and supplied to light emitting device as driving current. The preferred frequency of high-frequency current applicable to present CD players is of 300-500 MHz.

It is also conceivable not to provide such high-frequency current to the light emitting device to control power consumption. In addition, the mean value of high-frequency current in itself may also vary depending on temperature and aged deterioration. Thus, as the mean value of the high-frequency current varies, the level of the driving current changes. Since a slight level fluctuation may increase the probability of detection errors, smaller level fluctuation is preferred.

The present invention is achieved in consideration of the above-mentioned problems, and therefore an object of the present invention is to provide a light emitting device driving circuit capable of suppressing level fluctuation of the driving current in a state, where the light emitting device driving circuit superimposes high-frequency current components onto direct current components to generate a driving current which in turn is supplied to the light emitting device.

In order to address the above-mentioned problems, a light emitting device driving circuit according to the present invention comprising a first and a second current mirror circuits each of which having a pair of parallel lines in a state, where each one side line of said parallel lines is connected to said light emitting device; applying direct current and high-frequency current respectively to the other side lines of the line pairs in the first and the second current mirror circuits; and supplying, through a node of the connection, driving current generated by superimposing high-frequency current onto direct current, wherein, there is provided an amplitude setting transistor for controlling, by using an input of reference direct current signal, the amplitude of the high-frequency current flowing through the second current mirror circuit so that direct current components generated based on the reference direct current signal may be subtracted from the direct current flowing through said other side line of said line pair of the first current mirror circuit.

More specifically, as the amplitude of the high-frequency current in the second current mirror circuit increases, the direct current component of the high-frequency current increases, thereby increasing the mean value of the driving current given as the sum of the currents respectively flowing through each one side line of the first and the second current mirror circuits.

When reference direct current signal which is input into the amplitude setting transistor increases, the amplitude of the high-frequency current flowing through the second current mirror circuit increases thereby increasing the mean value of the driving current, while fluctuation of the mean value of the driving current may be controlled because the direct current component generated from the reference direct current signal is subtracted from the direct current flowing through the other side line of the first current mirror circuit. That is to say, since the driving current is generated by superimposing the direct current which is equivalent or proportional to the direct current flowing through the other side line of the first current mirror circuit onto the high-frequency current, the above-mentioned direct current component is subtracted from the driving current, whereby fluctuation of the mean value of the driving current can be suppressed.

In addition, level fluctuation of the driving current can be significantly suppressed when the increment of the direct current component of said high-frequency current is set to be proportional to the direct current component which will be subtracted from the direct current flowing through said other side line of said first current mirror circuit.

A light emitting device driving circuit of the present invention comprises a variable current source for providing current to a node on said side line in said first current mirror circuit, and preferably comprises a constant current source for keeping the amount of current supplied from this side line and said variable current source at a constant value.

In this case, depending on the amount of the current supplied from the variable current source, the current flowing through one and the other side lines of the first current mirror circuit, i.e., the size of the direct current component supplied to the light emitting device, can be controlled.

Furthermore, in the light emitting device driving circuit of the present invention, said variable current source is composed of a current mirror circuit, with a transistor disposed downstream of the input side line of the current mirror circuit, wherein upon application of a current control voltage to the control terminal of the transistor, the amount of the current supplied from the variable current source, i.e., the size of the direct current component supplied to the light emitting device can be controlled, depending on the level of the current control voltage.

In addition, the light emitting device driving circuit of the present invention comprises a high-frequency generation circuit for generating said high-frequency current, said amplitude setting transistor preferably being connected to said high-frequency generation circuit so that the upstream electric potential thereof determines the amplitude of said high-frequency current.

In this case, the amplitude of the high-frequency current component supplied to the light emitting device can be controlled by adjusting the upstream electric potential of the amplitude setting transistor.

In the light emitting device driving circuit of the present invention, a common-mode voltage is preferably input into the control terminal of said transistor disposed downstream of the input side line of said variable current source, and the control terminal of said amplitude setting transistor.

In this case, direct current and high-frequency current supplied to the light emitting device can be altered in phase, since the input voltage to the control terminal of said transistor and the input voltage to the control terminal of said amplitude setting transistor have a common mode.

BEST MODES FOR CARRYING OUT THE INVENTION

The light emitting device driving circuit according to an embodiment is described below. Like elements will be designated by like numerals and redundant description will be omitted.

Figure 1:
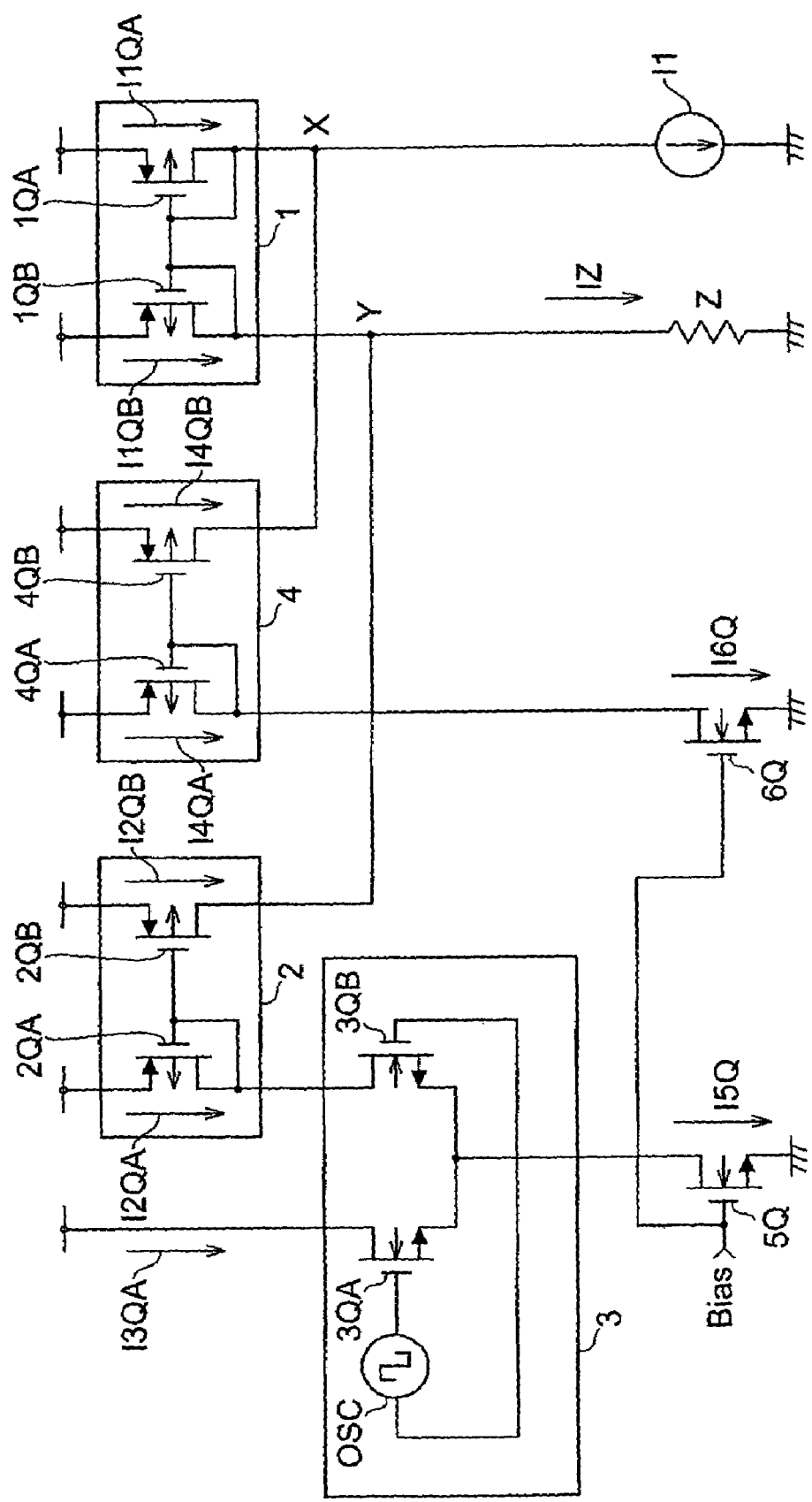
FIG. 1 is a circuit diagram of the light emitting device driving circuit.

FIG. 1 is a circuit diagram of a light emitting device driving circuit. The current mirror circuit, composed by connecting the control input terminals of two transistors, has two parallel lines through which currents of the transistors flow respectively.

A plurality of current mirror circuits 1, 2 and 4 are described in the following description, wherein current mirror circuits 1, 2 and 4 respectively have, as shown in the case of FET, transistor pairs 1QA, 1QB; 2QA, 2QB; 4QA, 4QB, each gate thereof being connected as the control input terminal. Here, in the case of a bipolar transistor, the control input terminal functions as the base.

The present driving circuit comprises a first current mirror circuit 1 (circuit for supplying direct current) and a second current mirror circuit 2 (circuit for supplying high-frequency current), each having a pair of parallel lines. Each one side line in current mirror circuits 1 and 2 is connected to a light emitting device(load) Z.

By passing direct current and high-frequency current respectively through the other side lines of said parallel lines in the first and the second current mirror circuits 1 and 2, the present driving circuit supplies driving current IZ generated by superimposing direct current onto high-frequency current to light emitting device Z, through a connection node Y.

First the configuration of the part of direct current will be described. A direct current source I1 (from which current I1 may flow) is connected at a downstream region of the other side line in the first current mirror circuit 1, so that direct current component I4QB flows between this side line and the current source I1 through node X. Accordingly, current I1QA, generated as a result of subtracting direct current component I4QB from direct current I1, flows through an upstream region beyond node X of the side line, whereas current I1QB which is equivalent or proportional to current I1QA flows through the counterpart side line.

In essence, direct current I1QB supplied to light emitting device Z is generated as a result of subtracting a predetermined direct current I4QB from direct current I1. The determined direct current component I4QB is generated in current mirror circuit 4 for generating a direct current component. In other words, direct current component I4QA which is equivalent or proportional to direct current component I4QB flows through transistor 4QA which is the counterpart of transistor 4QB through which direct current component I4QB flows. Direct current component I4QA is proportional to a reference direct current signal (control voltage) Bias which is input to the control input terminal (gate) of direct current setting transistor 6Q disposed downstream of transistor 4QA.

Accordingly, direct current component I4QA (I4QB) generated based on reference current signal Bias is subtracted from direct current I1 flowing through the other of said side lines in the first current mirror circuit 1.

The configuration of the high-frequency side will be described next. Reference direct current signal Bias is also input into the control input terminal (gate) of amplitude setting transistor 5Q, thereby passing direct current I5Q through amplitude setting transistor 5Q. Direct current I5Q flowing through amplitude setting transistor 5Q is proportional to the amplitude of high-frequency current generated in high-frequency generation circuit (differential current switch) 3.

In other words, high-frequency generation circuit 3 has an oscillating circuit OSC for mediation between the control input terminals (gates) of a pair of transistors 3QA and 3QB, with an amplitude setting transistor 5Q being connected to the downstream side of transistors 3QA and 3QB to determine the aggregate sum (amplitude, direct current component) of currents I3QA and I2QA flowing through transistors 3QA and 3QB, respectively.

Figure 2:
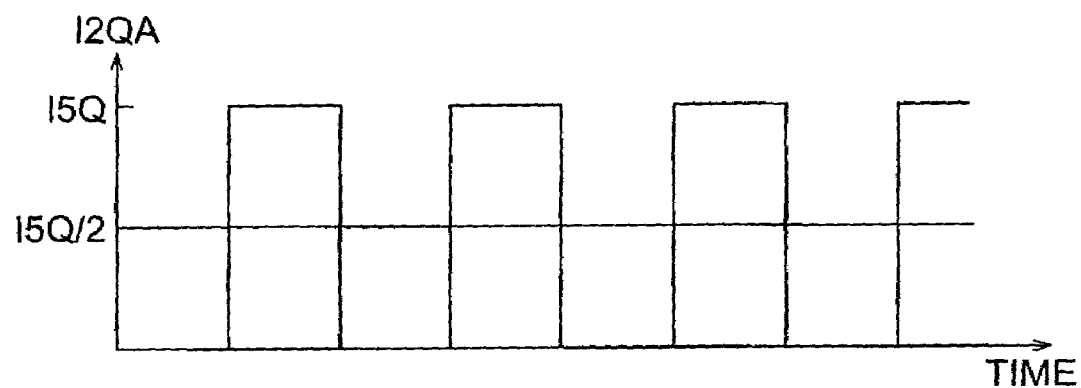
FIG. 2 is a graph of current I2QA flowing in one of the side lines of the high-frequency generation circuit 3.

FIG. 2 is a graph showing current I2QA flowing through one of the side lines of high-frequency generation circuit 3. High-frequency generation circuit 3 completely separates current I5Q into I3QA and I2QA according to the phase of an oscillating circuit OSC. Thus, I2QA becomes a pulse current having a peak value corresponding to I5Q, and consequently, has a direct current component of I5Q/2.

Current I2QA flowing through transistor 3QB, one of the two transistors in the high-frequency generation circuit 3, is equivalent to the current flowing through said other side line of the second current mirror circuit 2 for high-frequency. Thus, current I2QB which is equivalent or proportional to current I2QA flows through transistor 2QB and is supplied to light emitting device Z through node Y, transistor 2QB being the counterpart of transistor 2QA through which current I2QA flows.

In essence, amplitude setting transistor 5Q controls the amplitude of high-frequency current I2QA(I2QB) flowing through the second current mirror circuit 2 according to the input of reference direct current signal Bias.

When the amplitude of high-frequency current I2QA (I2QB) in the second current mirror circuit 2 increases, the direct current component of which increases, and consequently the mean value of driving current IZ given as the sum of the currents respectively flowing through each one side line of both the first and the second mirror circuits 1, 2 increases.

When reference direct current signal Bias which is input into amplitude setting transistor 5Q increases, the amplitude of high-frequency current I2QA(I2QB) flowing through the second current mirror circuit 2 increases and the mean value of driving current IZ increases, while fluctuation of the mean value of driving current IZ will be suppressed since direct current component I4QA(I4QB) generated from reference direct current signal Bias is subtracted from direct current I1 flowing through the other side line of the first current mirror circuit 1.

In other words, since driving current IZ results from superimposing direct current I1QB which is equivalent or proportional to direct current I1QA flowing through the other side line of the first current mirror circuit 1 onto high-frequency current I2QB, direct current component I4QA(I4QB) is subtracted from driving current IZ, whereby fluctuation of the mean value of driving current can be suppressed.

Here, description will be provided about the current flowing through each transistor. Let us assume that I1QB=G1*I1QA, I2QB=G2*I2QA, I4QB=G4*I4QA, where G1, G2, and G4 are gain ratios of the transistors, with a value of 1, for example. I1QB=I1−I4QB holds, since I1QB and I4QB will be added at node X to give I1. Here, driving current IZ is an addition of currents I1QB and I2QB, each current being added at node Y.

Transistors 5Q and 6Q have a common gate, which is connected to reference direct current signal Bias. Each current is controlled by reference direct current signal Bias. Let coefficient G56 be the gain ratio between transistors 5Q and 6Q, the size of each transistor is determined so that the current ratio will be I6Q=G56*I5Q. The amplitude of high-frequency current is controlled by reference direct current signal Bias.

In other words, $$IZ = I1QB + I2QB$$
$$= G1 * I1QA + I2QB$$
$$= G1 * (I1 - I4QB) + I2QB$$
$$= G1 * (I1 - G4 * I4QA) + G2 * I2QA$$
$$= G1 * (I1 - G4 * G56 * I5Q) + G2 * I2QA$$
$$= G1 * I1 - G1 * G4 * G56 * I5Q + G2 * I2QA \text{ holds.}$$

Let <IZ> denote the temporal mean value of driving current IZ, then, $$<IZ> = G1*I1 - G1*G4*G56*I5Q + G2*(I5Q/2)$$

holds (equation A). Here, the temporal mean value of IZ (level) is set so as not to be varied by reference direct current signal Bias. In other words, it is sufficient that the second and the third terms of equation A cancel each other in order to keep the temporal mean value of driving current IZ invariant against the change of the amplitude of high-frequency current.

Thus, G1*G4*G56=G2/2 holds. In this case <IZ>=G1*I1. G2=2 holds assuming that G1=G4=G56=1.

In other words, level fluctuation of driving current IZ can be significantly suppressed, since the increment (caused by the increase of amplitude) of the direct current component included in high-frequency current I2QB is set to be proportional (or equivalent) to direct current component I4QB which is subtracted from direct current I1 flowing through the other side line of the first current mirror circuit 1.

Figure 3:
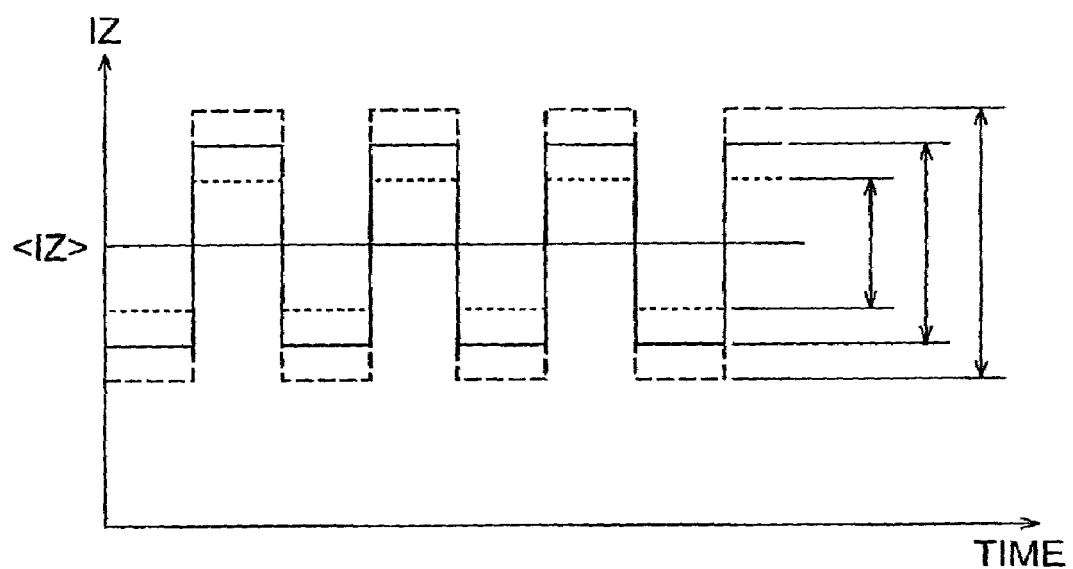
FIG. 3 is a graph illustrating the wave form of driving current IZ.

FIG. 3 is a graph showing the waveform of driving current IZ when the above equations hold. As can be seen from the graph, mean current <IZ> is invariant against the change of the amplitude of driving current IZ.

As described above, since fluctuation of the temporal mean value of driving current IZ is suppressed in the above mentioned light emitting device driving circuit, the intensity of laser light does not vary regardless of the presence of high-frequency superimposing when the light emitting device driving circuit is driven with light emitting device Z as the laser diode, which is particularly effective when using hologram in the optical system.

In addition, for an optical disk memory, laser light is irradiated onto the disk surface to read information. Laser diodes are used as the laser source, in which case reflected light from the disk returns to the LD, causing noise. The above-mentioned light emitting device driving circuit is also effective when superimposing high-frequency (300-500 MHz) as a solution since level fluctuation is suppressed.

As described above, the above-mentioned light emitting device driving circuit comprises a variable current source 4 for supplying current to node X on the other side line in the first current mirror is circuit 1, and a constant current source I1 for preserving the sum of current value I1QA flowing through this side line and current value I4QB supplied from variable current source 4 to a constant value.

In this case, depending on the amount of current I4QB supplied from variable current source 4, the amount of current flowing through one and the other side line of the first current mirror circuit 1, i.e., the size of direct current component supplied to light emitting device Z can be controlled.

In addition, variable current source 4 is composed of current mirror circuit 4, with light emitting device driving circuit having a transistor 6Q disposed downstream of input side line of current mirror circuit 4, and when current control voltage Bias is applied to the control terminal (gate) of transistor 6Q, the amount of current I4QB supplied from variable current source 4, i.e., the size of direct current component supplied to light emitting device Z can be controlled depending on the size of this current control voltage Bias.

In addition, the light emitting device driving circuit of the present invention comprises high-frequency generation circuit 3 for generating high-frequency current, wherein amplitude setting transistor 5Q is connected to high-frequency generation circuit 3 so that the upstream electric potential determines the amplitude of high-frequency current.

Thus, the amplitude of high-frequency current component supplied to light emitting device Z can be controlled by adjusting upstream electric potential of transistor 5Q using voltage Bias.

In addition, in the light emitting device driving circuit, a common mode voltage Bias is input into the control terminal of transistor 6Q which is disposed downstream of the input side line of variable current source 4 and the control terminal of amplitude setting transistor 5Q.

In this case, direct current and high-frequency current supplied to light emitting device Z can be altered in phase, since input voltage Bias to the control terminal of transistor 6Q and input voltage Bias to the control terminal of amplitude setting transistor 5Q have a common mode.

As described above, level fluctuation of driving current can be suppressed according to the light emitting device driving circuit of the present invention.

INDUSTRIAL APPLICABILITY

The present invention can be used for light emitting device driving circuits.

The invention claimed is:
1. A light emitting device driving circuit comprising:
first and second current mirror circuits each of which having a pair of parallel lines in a state, where each one side line of said parallel lines is connected via a connection node to said light emitting device; applying direct current and high-frequency current respectively to the other side lines of the line pairs in said first and second current mirror circuits, a direct current source being connected at a downstream region of the other side line of the first current mirror circuit; and supplying, through the connection node, driving current generated by superimposing high-frequency current onto direct current,
wherein, there is provided an amplitude setting transistor for controlling, by using an input of reference direct current signal, the amplitude of the high-frequency cur- rent flowing through said second current mirror circuit so that a direct current component generated based on said reference direct current signal is subtracted from the direct current flowing from the direct current source in said other side line of said line pair of said first current mirror circuits, wherein the increment of the direct current component of said high-frequency current is set to be proportional to the direct current component subtracted from the direct current flowing from the direct current source in said other side line of said line pair of said first current mirror circuit.

2. A light emitting device driving circuit according to claim 1, comprising a variable current source for supplying current to a node in said other side line in said first current mirror circuit, wherein the direct current source is configured to preserve the current value supplied from this line and said variable current source to a constant value.

3. A light emitting device driving circuit according to claim 2, said variable current source being composed of a current mirror circuit, with a transistor disposed downstream of input side line of the current mirror circuit, wherein a current control voltage is applied to the control terminal of the transistor.

4. A light emitting device driving circuit according to claim 3, comprising a high-frequency generation circuit for generating said high-frequency current, wherein said amplitude setting transistor is connected to said high-frequency generation circuit so that the upstream electric potential determines the amplitude of said high-frequency current.

5. A light emitting device driving circuit according to claim 4, wherein a common mode voltage is input to the control terminal of said transistor disposed downstream of the input side line of said variable current source, and the control terminal of said amplitude setting transistor.

* * * * *